(12) United States Patent
Ott (10) Patent No.: US 10,892,371 B2
(45) Date of Patent: Jan. 12, 2021

(54) SOLAR MODULE CONSTRUCTION

(71) Applicant: S. E. Track AG, Zug (CH)

(72) Inventor: Christoph Ott, Worb (CH)

(73) Assignee: S. E. TRACK AG, Zug (CH)

( * ) Notice: Subject to any disclaimer, the term of this patent is extended or adjusted under 35 U.S.C. 154(b) by 406 days.

(21) Appl. No.: 14/947,857

(22) Filed: Nov. 20, 2015

(65) Prior Publication Data
US 2016/0149537 A1    May 26, 2016

(30) Foreign Application Priority Data
Nov. 20, 2014   (CH) .................................. 1791/14

(51) Int. Cl.
| | | |
|---|---|---|
| *H02S 30/10* | (2014.01) | |
| *H01L 31/042* | (2014.01) | |
| *H02S 20/23* | (2014.01) | |
| *H02S 20/00* | (2014.01) | |
| *F24S 25/13* | (2018.01) | |
| *F24S 25/16* | (2018.01) | |
| *F24S 20/00* | (2018.01) | |
| *F24S 25/00* | (2018.01) | |

(52) U.S. Cl.
CPC ............ *H01L 31/042* (2013.01); *F24S 25/13* (2018.05); *F24S 25/16* (2018.05); *H02S 20/00* (2013.01); *H02S 20/23* (2014.12); *F24S 2020/18* (2018.05); *F24S 2025/017* (2018.05); *Y02B 10/10* (2013.01); *Y02E 10/47* (2013.01); *Y02E 10/50* (2013.01)

(58) Field of Classification Search
CPC ....................................................... H02S 30/20
See application file for complete search history.

(56) References Cited

U.S. PATENT DOCUMENTS

| | | | | |
|---|---|---|---|---|
| 4,031,674 A | * | 6/1977 | Rand ....................... | E04H 15/22 52/2.14 |
| 4,398,053 A | * | 8/1983 | Orillion ................... | F24S 60/30 136/248 |
| 4,401,710 A | * | 8/1983 | Bansemir ............... | B64G 1/443 136/245 |

(Continued)

FOREIGN PATENT DOCUMENTS

| | | |
|---|---|---|
| DE | 2738857 | 3/1979 |
| DE | 202009017110 | 4/2010 |

(Continued)

*Primary Examiner* — Sadie White
(74) *Attorney, Agent, or Firm* — SoCal IP Law Group LLP; Mark A. Goldstein; Angelo J. Gaz (57) ABSTRACT

A solar module construction comprises at least one pyramidal support unit with a triangular base and triangular lateral planes as well as photovoltaic units provided on at least one of the lateral planes of the support unit. The support unit includes a supporting frame which spans the triangular base by means of base struts and the lateral planes by means of lateral struts. At least one of the lateral planes is stretched over with a flexible material. On at least one lateral plane photovoltaic units in the form of flexible solar modules are installed on the membrane. A multiplicity of such solar module constructions together forms a solar module array, preferably with solar module pairs, which are composed of two solar module constructions and form a parallelogram.

23 Claims, 6 Drawing Sheets

(56) References Cited

U.S. PATENT DOCUMENTS

| | | | | |
|---|---|---|---|---|
| 4,579,302 A | * | 4/1986 | Schneider | B64G 9/00 |
| | | | | 136/292 |
| 5,212,916 A | * | 5/1993 | Dippel | E04B 7/14 |
| | | | | 52/82 |
| 5,829,427 A | * | 11/1998 | Gallois-Montbrun | ........................ |
| | | | | F24S 30/452 |
| | | | | 126/600 |
| 2008/0264460 A1 | * | 10/2008 | Hentschel | E04H 15/003 |
| | | | | 135/91 |
| 2009/0173377 A1 | * | 7/2009 | Meininger | E04H 1/1205 |
| | | | | 136/251 |
| 2011/0005560 A1 | * | 1/2011 | Nair | E04H 15/14 |
| | | | | 135/96 |
| 2012/0118353 A1 | | 5/2012 | Fishier | |
| 2013/0153006 A1 | | 6/2013 | Cox et al. | |

FOREIGN PATENT DOCUMENTS

| | | |
|---|---|---|
| DE | 202010003130 | 9/2010 |
| DE | 20211109461 | 4/2012 |
| EP | 0867946 | 9/1998 |
| EP | 2042822 A2 | 4/2009 |
| EP | 2631389 | 8/2013 |
| JP | 2012 224982 | 11/2012 |

* cited by examiner

SOLAR MODULE CONSTRUCTION

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

This patent claims the benefit of priority from Swiss Patent Application No. 1791/14, filed Nov. 20, 2014, contents of which are incorporated herein by reference in their entirety.

BACKGROUND

This disclosure relates to a solar module construction and a solar module array for photovoltaically used areas, for example structures on or over railway facilities, buildings, open outdoor spaces, etc. In particular the disclosure relates to a three-dimensional, modularly constructed solar module construction.

Open spaces are being increasingly equipped with solar modules for conversion of solar energy into electrical energy. For example, solar panels are installed on roof structures, wall surfaces and even on areas formerly used for agricultural purposes and are aligned with respect to the sun in such a way that as much solar energy as possible can be captured and converted in the course of a day. For this purpose diverse constructions are known with which an optimal angular adjustment of the solar panels and an area-wide arrangement of a multiplicity of solar panels can be achieved. For further optimization of the capture of the solar energy, rotatable constructions are known, for example, which continuously align the solar panels according to the position of the sun. It is also known to use constructions which align adjacently situated panels in different directions so that different panels are aligned optimally with respect to the sun in the course of the day without the panels having to be moved.

Constructions of this kind are often complex in structure and set-up and costly in maintenance. Nonetheless the solar panels are often not aligned completely at an optimal angle. Furthermore there exists the problem that the individual panels cast shadows on each other and reduce the yield in electrical energy. Solar panels spaced apart from one another or rows of solar panels require a lot of space and leave an interim space unused.

Shown in WO 2012/172296 is, for example, a construction in which a supporting structure for solar units is designed in hemispherical shape. Placed on the hemispherical support is a multiplicity of solar units which have a quadrilateral pyramidal shape. The quadrilateral solar pyramids are disposed in rows and span the entire support. To cover larger areas, a multiplicity of such hemispherical supports can be disposed next to one another. Also with this construction there exists the problem that in relation to the area covered with solar units, a large portion of the photovoltaically active surfaces of the solar units is not aligned in a profitable way. Furthermore the mounting and the maintenance of such a support construction is complicated. Also the dimensions of a photovoltaically used area provided with this construction can be adapted only in a very limited way to the shape of an available area.

DESCRIPTION OF THE DRAWINGS

Advantageous embodiments of the invention will be presented in the following with reference to the drawings, which merely serve explanatory purposes and are not to be interpreted in a limiting way. Features of the invention disclosed in the drawings should be viewed as belonging to the disclosure of the invention individually and in every combination. Shown in the drawings are.

DETAILED DESCRIPTION

A construction for solar modules with a high degree of efficiency of the solar modules, simple in construction and mounting, and having an efficient use of space is described herein. Furthermore an array of solar modules which can be adapted in a simple way to existing conditions, can be provided on areas used for other purposes, is space-saving, and allows a simple maintenance is also described herein.

Such a solar module construction comprises at least one pyramidal support unit and photovoltaic units provided on the support unit. The support unit has a triangular base and triangular lateral planes. The support unit is designed as supporting frame, which spans the triangular base by means of base struts and the lateral planes by means of lateral struts. The interim space between the base struts or respectively the lateral struts is open. The base is advantageously designed as isosceles triangle, and preferably as equilateral triangle. The lateral planes are preferably designed as isosceles triangles. They can also have another three-cornered geometry, however, as long as the supporting frame overall forms a pyramidal shape. The supporting frame can thereby form a regular or a skewed pyramid. The catheti of the three lateral planes meet at one point which forms the tip of the pyramid and thus a head region of the support unit and of the solar module construction.

At least one of the lateral planes is spanned with a flexible material. Preferably all three lateral planes are spanned with a flexible material. The interim space between the base struts or respectively lateral struts is thereby covered by the flexible material. The material can be firmly attached to the base through holding means, so that it is fixed relative to the support unit.

Provided as flexible material is preferably a flexible membrane, such as a foil, for example. The membrane can be pulled over the head region of the support unit along the lateral planes to the base struts and fixed. A membrane as flexible material has the advantage that it has a minimal weight and is easily formable. An elastic membrane can also be used since it allows itself to be easily adapted to a shape of the lateral planes.

The flexible material can also be provided by a thin plate, however, which is so thin that it is bendable and thus flexible. Owing to the bendability, such a plate is not suitable as sole support, but requires the support unit in order to form a stable base for the photovoltaic units. The advantage of such a plate is minimal weight, easy handling and simple mounting on the support unit.

The photovoltaic units are provided on at least one of the lateral planes of the support unit. For a good energy yield per area covered with a solar module construction, all lateral planes are preferably provided with photovoltaic units. The photovoltaic units are attached in the form of flexible solar modules on the flexible material. Used as flexible solar modules are, for example, thin-film solar cells which are attached on a flexible foil. The flexible material, preferably a membrane, is first attached to the supporting frame and then the photovoltaic units are applied to the membrane. The membrane can thus be positioned precisely over the lateral planes, can be bent, if necessary also stretched and spanned, without the solar modules being damaged. The solar modules are positioned on the already fixed flexible material in a way relative to the geometry of the supporting frame and can thereby be disposed optimally in a simple way.

The flexible membrane can be composed of a membrane element, which spans completely the three lateral planes of the pyramidal supporting frame. Thus all three lateral planes can be covered over at the same time, and several individual steps are not required for covering individual lateral planes. Preferably the membrane material is elastic so that the membrane element can be deformed when being pulled onto the supporting frame and can be adapted to the geometry of the supporting frame. In particular the membrane can be bulged by the head region of the supporting frame so that the membrane is spanned tightly over the lateral planes. Alternatively to a full-area spanning of all three lateral planes, the lateral planes of the solar module construction can each be spanned with a membrane element individually.

The solar module constructions can thus be produced simply and quickly and can be kept in stock. The solar module constructions can thereby be stacked so that they take up little space in storage and during transport, despite the three-dimensional construction.

A multiplicity of such solar module constructions disposed next to each other can form a solar module array. The solar module constructions can thereby be installed individually or be put on common supports. Ensured by means of the three-sided pyramidal shape is that in the course of the day one lateral plane is always exposed to the solar radiation and contributes to the energy production. For energy production it is advantageous to use solar module constructions which are provided with photovoltaic units on all three lateral planes. The solar module array can also have other applications, however, as will be shown in the following, in which it can be advantageous to provide only one or two of the lateral planes with solar modules.

In one embodiment of a solar module array, the array is constructed from a multiplicity of solar module pairs, a solar module pair being formed by two adjacently disposed solar module constructions in which the bases of the solar module constructions border on one another and form together a parallelogram. Resulting from this is that the six lateral planes of the solar module pair are aligned in six different directions. The six different directions of the lateral planes can optimize the alignment of the solar modules of the solar module pairs relative to the sun, and the energy production can be increased. Furthermore the solar module pairs can be arranged in rows in the same alignment in each case in a way flush with one another and a straight line thereby results, whereby the construction of the solar module array and its mounting and maintenance is simplified.

With an advantageous geometry of a solar module construction, the base of the pyramidal supporting frame forms an equilateral triangle and the lateral planes enclose on a head region of the supporting frame an angle of between 50° and 70°, preferably 60°. The head region is thereby raised only slightly from the base surface of the supporting frame. The lateral planes thereby form only a minimal area exposed to wind and have a preferred angular setting with respect to the solar radiation.

The flexible material can be selected in a targeted way according to desired features. For example, the material can be transparent, reflecting, structured, sound-absorbing or tinted. With large-area solar module arrays, the array can thereby assume an additional function, such as, for example, providing shade, sound protection, roofing, etc.

In the case of individually spanned lateral planes of the solar module construction, the lateral planes can each be spanned with different materials. The lateral planes of the solar module construction can thereby have different features. The selection of the material features can be made according to the orientation of the solar module construction at a place of installation. For example, dark membranes can be selected for southwardly oriented lateral planes, and sound-absorbing membranes can be selected for lateral planes which are oriented toward busy streets.

For a high energy yield per area spanned with a solar module construction, the lateral planes are filled as completely as possible with photovoltaic units. Solar module constructions can also be provided, however, in which a lateral plane provided with solar modules has a region with flexible solar modules and a free region without solar modules, whereby the free region amounts to at least 10% of the lateral plane, preferably between 20% and 35%. The free region makes possible a passage of light in order to provide entry of light for surfaces covered by solar module constructions or respectively surfaces covered over with a solar module array. This can be advantageous with the use of solar module arrays described herein that are provided on or at greenhouses or that form the roof of a greenhouse.

In another advantageous embodiment of a solar module construction described herein the membrane or the plate can be perforated. An exchange between inner and outer sides of the solar module construction can thereby occur in solar module-free regions of the lateral planes. For example, an exchange of moisture outwardly and of fresh air inwardly can take place. Rain water, for example, can also pass at least partially through the solar module construction.

Furthermore the membrane or the plate can have a reinforcement, whereby the stability of the lateral planes is increased. The reinforcement can already be provided on the flexible material before the pulling onto the supporting frame or it can be put on afterwards. Preferably a mesh reinforcement is used which makes possible a stabilization in two different dimensions.

The supporting frame of the solar module construction is preferably designed in a modular way, the base struts, the lateral struts and corner connectors existing as uniform modules for assembly of the supporting frame. The corner connectors serve to connect the base struts and the lateral struts and to fix the flexible material, in particular the membrane, over the lateral struts to the base. Preferably the base struts also have holding means for holding the material, such as, for example, clamping strips or adhesive surfaces. Preferably a head connector is provided for connecting the lateral struts on the head region of the supporting frame, which head connector is installed on the lateral struts at least partially over the membrane in a head region of the solar module construction. The lateral struts are thereby held in position and at the same time the membrane is fixed.

In an advantageous embodiment of a solar module array described herein, a multiplicity of parallel-running support rods are provided for carrying the solar module constructions. Every two parallel support rods thereby carry a multiplicity of solar module constructions, in particular solar module pairs, as described above. The solar module construction or respectively solar module pairs are preferably provided abutting one another in rows on the support rods. A multiplicity of such rows are disposed parallel, bordering on one another, so that the solar module array can form a closed surface. The support rods can also have a mounting rail so that a mounting trolley can drive over the solar module constructions on the parallel tracks of two parallel support rods. This makes possible a simple equipping of the support rods with solar module constructions and a simple maintenance of the solar module constructions of a solar module array. The support rods can be adapted in their height to the application area of the solar module array. Furthermore, by means of the support rods, the inclination of a solar module array can be adjusted relative to the covered-over surface or respectively relative to the solar radiation.

The solar module arrays are described herein with reference to several embodiment examples. The individual technical features of one example can absolutely be used also in combination with another example with the explained advantages. The description of the technical features is not necessarily limited to the respective embodiment example.

Although the solar module arrays will be explained more precisely in the following using examples with a flexible membrane as flexible material, it is emphasized however that a flexible plate can also be used as flexible material, as previously stated.

Figure 1A:
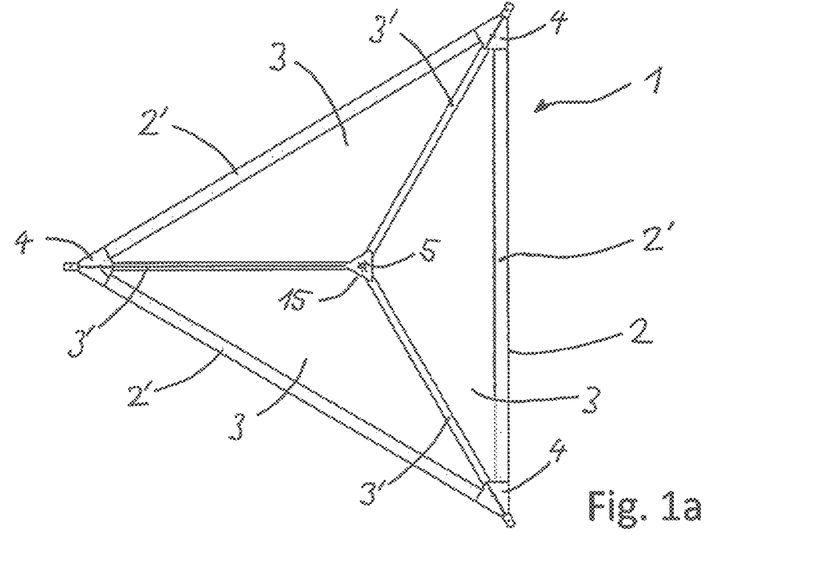
FIG. 1a is a view from above of a supporting frame of a solar module construction.
Figure 1B:
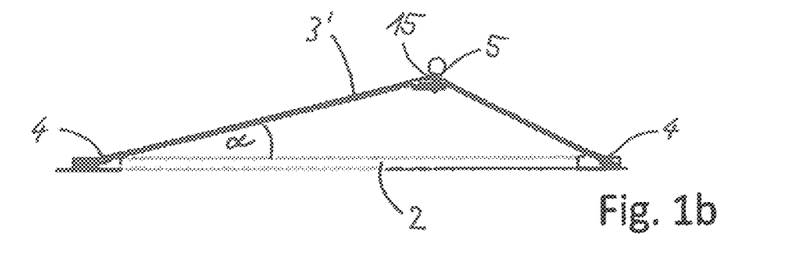
FIG. 1b is a lateral view of the supporting frame from FIG. 1a without membrane.

Shown in FIGS. 1a and 1b is a support unit of a solar module construction described herein, which is designed as supporting frame 1. The supporting frame 1 comprises base struts 2', which span a triangular base 2. In the embodiment example shown, the base is designed as equilateral triangle, and the three base struts 2' are thus of the same length. Lateral planes 3 are spanned by a base strut 2' and in each case two lateral struts 3'. The lateral struts 3' are equally long in the embodiment example shown, so that the lateral planes are designed as equilateral triangle. The base struts 2' and the lateral struts 3' are connected at the corners by corner connectors 4, and the three lateral struts 3' are connected by a head connector 5 in a head region 15 of the supporting frame 1. The supporting frame 1 forms a three-dimensional pyramidal support unit with three equally large lateral planes 3.

In principle, the pyramidal geometry can however also have lateral planes of differing size, and the base struts or respectively lateral struts do not have to have the same length. A base in the form of at least an isosceles triangle is preferred so that during the joining of two solar module constructions to form a solar module pair a parallelogram results, as will be explained more precisely later.

Shown from the side in FIG. 1b is the supporting frame 1. From this it can be seen that the lateral struts 3' rise up from the surface spanned by the base 2. In the embodiment shown, the lateral struts 3' protrude from the surface of the base 2 at an angle α of 26°. Other angles and different angles for the different lateral struts can also be selected, however, depending upon area of application and orientation of the area on which the solar module constructions are used.

Figure 2:
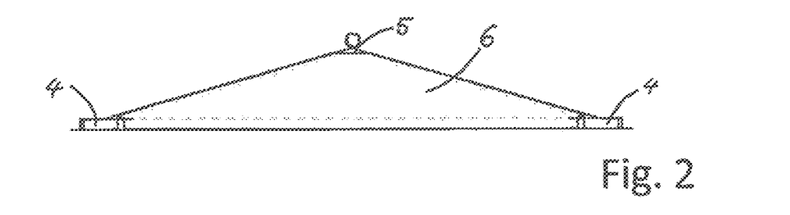
FIG. 2 is a lateral view of the other side of the supporting frame from FIG. 1a with membrane.

In FIG. 2 the supporting frame 1 is stretched over with a flexible membrane 6. The membrane 6 is designed in this embodiment example as membrane element, which is stretched over the three lateral planes 3 of the pyramidal supporting frame 1 and is fixed to the supporting frame 1 by means of the corner connectors 4. In addition, the membrane can be pulled over the outer sides of the base struts and be firmly attached along the base struts. Furthermore the membrane can be fixed to the lateral struts 3' by the head connector. For this purpose a first head connector element can be put on from above and a second head connector element can be put on from below. First and second head connector elements are connected to one another, e.g. screwed, whereby they clamp the membrane between them and fix the lateral struts 3'. On the first head connector element a hook or a loop can protrude upward which can serve for grasping and transporting the solar module construction.

Figure 3:
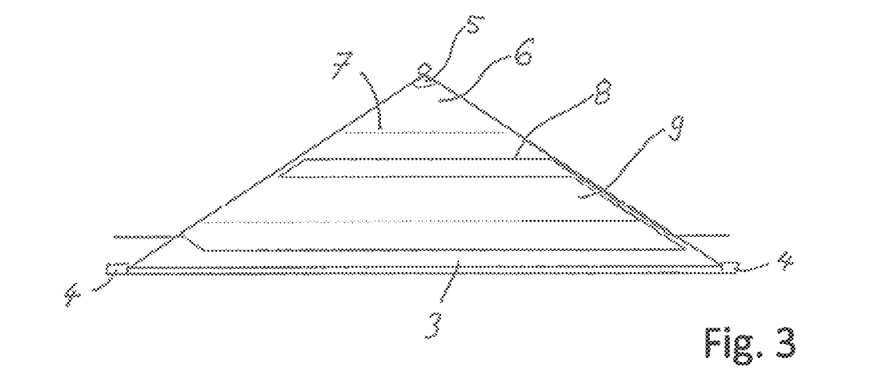
FIG. 3 is a diagrammatic representation of a lateral plane of a solar module construction.

Shown in FIG. 3 is a lateral plane 3 of the solar module construction, on which photovoltaic units in the form of flexible solar modules 7 are attached on the membrane 6. The solar modules 7 are formed e.g. by photovoltaically active wafers. For example, 60 solar modules 7 are disposed in rows next to and parallel to each other, and are connected to each other in a conventional way with a cabling 8, so that solar energy can be captured and converted into electrical energy and conducted. As can be seen FIG. 3, the lateral plane 3 has a region which is covered with solar modules 7, and also a free region 9 without solar modules, whereby the regions do not have to be contiguous. The free region 9 corresponds in the example shown to approximately 20% of the lateral plane 3. The wafers can have a front foil, e.g. ETFE foil, and a rear foil, e.g. designed as modified polyamide foil, which together form the foil base for the solar modules 7. The wafers, e.g. silicon wafers, are laminated between the front and the rear foil including a wiring for a cabling 8. The solar modules 7 can be combined into a photovoltaic area module by means of the foil base and be installed together through attachment on the membrane. Depending upon the material used, different connecting techniques can be used, e.g. adhering, sewing, laminating, vulcanizing or riveting.

Figure 4:
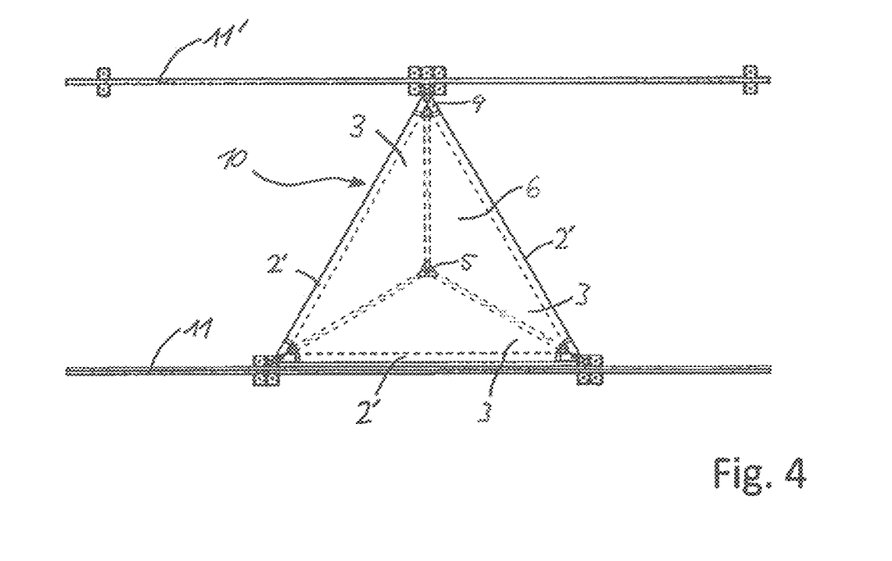
FIG. 4 is a view from above of a variant of a solar module construction on parallel-running support rods.

Shown in FIG. 4 is a solar module construction 10 described herein which is designed as described in the foregoing. The solar modules 7 have been omitted in the drawing, however, in order to provide a better overview. The solar module construction 10 is placed on two parallel-running support rods 11, 11', and is fixed thereon at the corners of the base 2. One of the base struts 2' thereby runs parallel to a support rod 11, and the two other base struts 2' rise from the support rod 11 to the support rod 11'. The corners of the parallel-running base strut 2' thus lie on the support rod 11. The corner of the base which lies opposite the parallel-running base strut 2' thereby lies on the other support rod 11'. Owing to the symmetrical geometry of the solar module construction 10, a further solar module construction 10' (see FIG. 5) can be placed, turned by 180°, next to the solar module construction 10 shown, in such a way that the base struts of the two solar module constructions come to lie against each other in a parallel way. Basically it is thereby also conceivable that one base strut can be used jointly for both solar module constructions 10 and 10' and the common base strut belongs to the two adjoining bases. Two solar module constructions disposed in this way in relation to one another form a solar module pair, as will be explained more precisely in the following. The solar module pair is formed by a kind of double pyramid.

Figure 5:
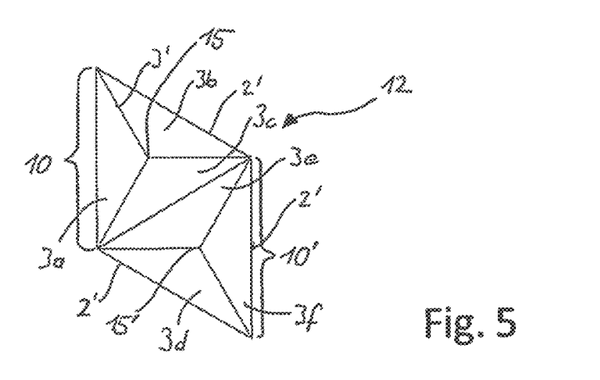
FIG. 5 is a diagrammatic representation of a variant of a solar module pair.

Shown in FIG. 5 is such a solar module pair 12 with a first solar module construction 10 and, turned by 180° thereto, a second solar module construction 10'. The solar module pair 12 spans a parallelogram with the side lengths of the base struts 2'. The spacing apart of the opposite base struts 2' thereby corresponds advantageously to the spacing apart of the parallel-running support rods 11 and 11', as shown in FIG. 4. Here, too, for better clarity, the solar modules 7 have not been shown. The solar module pair 12 has six lateral planes 3, which are each oriented in different directions. Belonging to the solar module construction 10 are the lateral planes 3a, 3b and 3c. Belonging to the solar module construction 10' are the lateral planes 3d, 3e and 3f.

Figure 6:
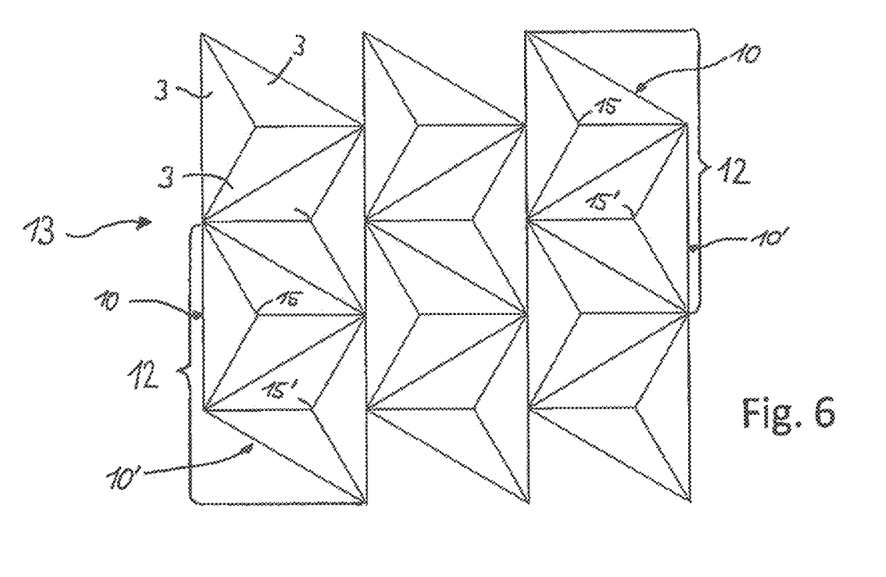
FIG. 6 is a diagrammatic representation of a variant of a solar module array with solar module pairs according to FIG. 5.

Shown diagrammatically in FIG. 6 is such a solar module array 13 described herein which is composed of solar module pairs according to FIG. 5. For this purpose the solar module constructions 10 are mounted individually or as solar module pairs 12 in rows on the support rods 11, 11'. Shown are three rows, arranged parallel, of solar module pairs. Each row is shown with two solar module pairs 12 although in actually used solar module arrays, as a rule, more than two solar module pairs are used, as can be seen from FIG. 8. The solar module pairs 12 of one row abut with their bases in such a way that a strip of solar module constructions results that has a common rectilinear axis. The edge of the solar module pairs arranged against each other in rows forms on both sides a continuous straight edge which rests on the support rod. The individual rows can be disposed shifted with respect to one another, as desired. An optically pleasant impression results when the solar module pairs 12 are disposed at the same height with the same orientation in adjacently situated rows.

Figure 7:
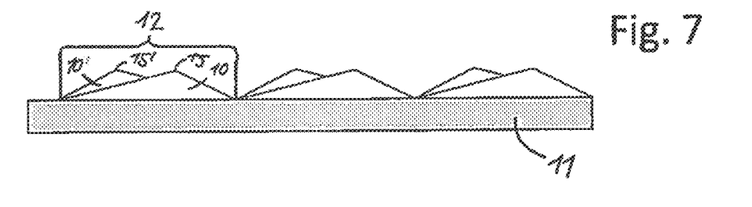
FIG. 7 is a lateral view of the solar module array with solar module pairs according to FIG. 6.

The solar module array 13 is shown in FIG. 7 in a lateral view of one row of solar module pairs 12 with a section through a support rod 11. From the view it can be seen that the head region 15 of the solar module construction 10 and the head region 15' of the solar module construction 10' are offset with respect to one another. The solar module construction 10 and 10' of solar module pairs 12 lying behind one another are aligned in FIG. 7 such that only one solar module pair 12 is to be seen in each case.

Figure 8:
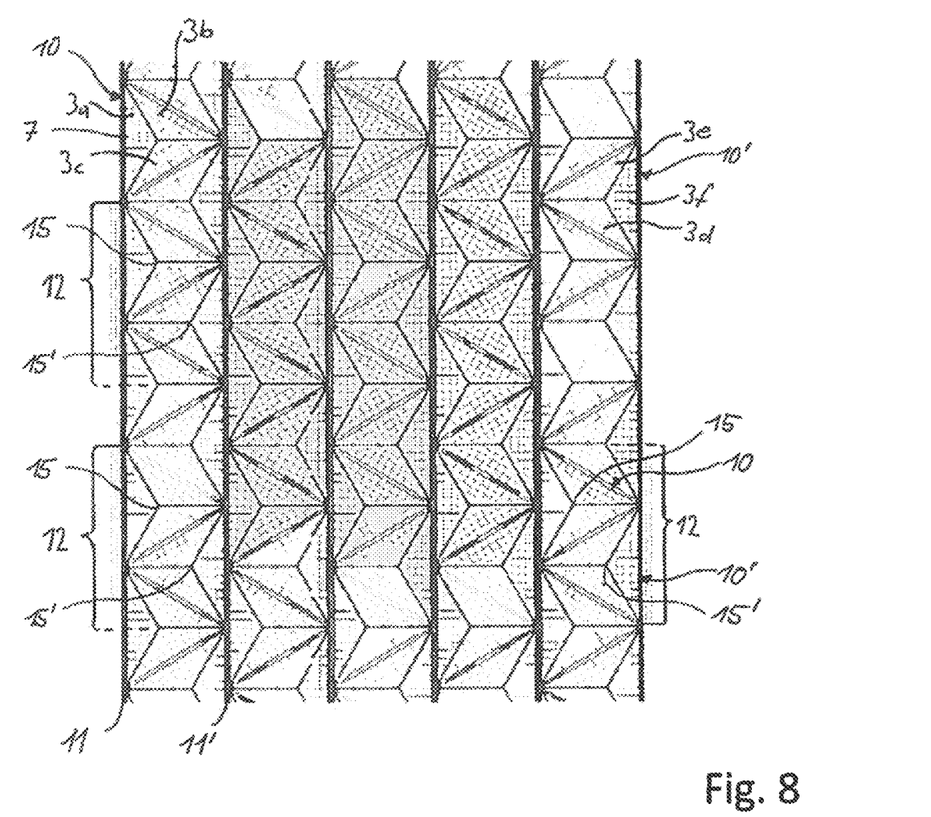
FIG. 8 is a diagrammatic representation of a further variant of a solar module.
Figures 8A, 8B:
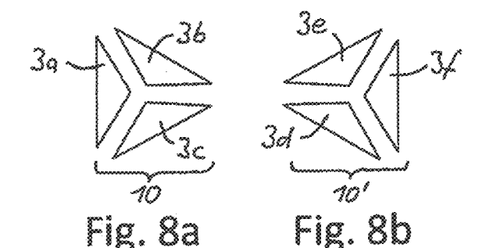
FIG. 8a is a diagrammatic representation of the orientation of lateral planes of a first solar module construction of a solar module pair of the solar module array from FIG. 8.
FIG. 8b is a diagrammatic representation of the orientation of lateral planes of a second solar module construction of a solar module pair of the solar module array from FIG. 8.

Shown in FIG. 8 is an example of a solar module array 13, which can serve as a roofing for railway tracks. Shown are five parallel-running rows of solar module pairs 12, which are mounted on support rods 11, 11'. The solar module pairs 12 of one row are arranged in a way connected together as shown in FIG. 6. Shown moreover in FIG. 8 are the solar modules 7, which are disposed on the lateral planes 3 of the solar module constructions 10 and 10' of the solar module pairs 12. Belonging to one solar module pair 12 are the six lateral planes 3a, 3b, 3c, 3d, 3e and 3f of the solar module constructions 10 and 10', as can also be seen from FIG. 5. In the example shown, the lateral plane 3a is oriented westward, the lateral plane 3b northeastward, the lateral plane 3c southeastward, the lateral plane 3d southwestward, the lateral plane 3e northwestward and the lateral plane 3f eastward. Provided in southerly direction are thereby the lateral planes 3c and 3d, and in northerly direction the lateral planes 3b and 3e. A good orientation of the lateral planes for energy production thereby results for all directions.

Figure 9:
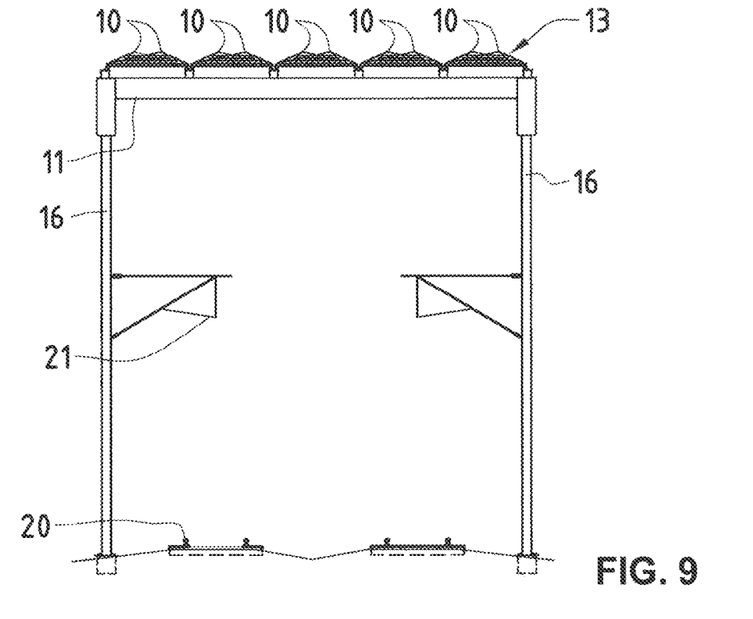
FIG. 9 is a diagrammatic representation of a first application of a solar module array over railway tracks.

Shown in FIG. 9 is a first application of a solar module array with solar module constructions described herein as roofing for railway tracks 20 and overhead lines 21 belonging thereto. The support rods 11 are borne by poles 16 and are disposed over the overhead lines. Shown along the support rods 11 is, by way of example, a row of solar module constructions 10 which belong to solar module pairs, as previously described. Provided are a multiplicity of rows of solar module pairs, which form together a solar module array 13, as is shown in FIG. 8. The solar module constructions 10 in this application are spanned with a membrane which is impermeable to water and is slightly opaque. The solar module constructions 10 can be mounted on the support rods 11 by means of a sealing in such a way that no water can penetrate between support rods and solar module construction. The solar module array 13 thereby protects the area covered by it against precipitation.

Figure 10:
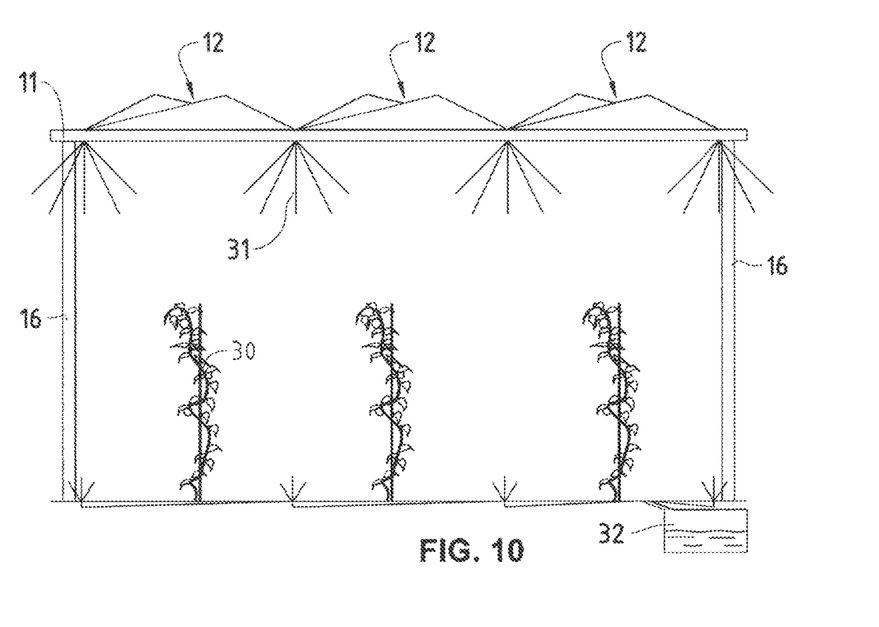
FIG. 10 is a diagrammatic representation of a second application of a solar module array at a greenhouse.

Shown in FIG. 10 is a second application for a solar module array 13 with solar module pairs 12, which serves as structure for an area with plants 30. The solar module pairs 12 are again attached to support rods 11, which in turn are borne on poles 16. In this application it is advantageous to use a perforated and transparent membrane, so that rainwater for irrigation 31 can penetrate through the membrane. Provided on the lateral planes are preferably larger solar-module-free regions, for example 25% to 35% of the lateral plane, in order to facilitate exposure of the area with plants 30 to sunlight. The rainwater can also be collected in a catch basin 32 and conveyed to the area with plants 30. The electrical energy produced with the solar module array 13 can be used, for example, for operation of such an irrigation system, so that an energy-neutral greenhouse facility results. In principle, the catch basin 32 can also be filled with groundwater.

A solar module array, as previously described, can also be provided in connection with an air dehumidifier. For example, the air dehumidifier can be operated by means of the energy produced by the solar module array. The air dehumidifier can be used for water procurement in that the separated water is collected and used elsewhere. For example, the water can be used for irrigation of a greenhouse. An air dehumidifier based on air-cooling with water separation can, for example, be operated using the energy generated by the solar module array. Other dehumidifying concepts can also be applied, depending upon the climatic conditions of the surroundings.

It is claimed:

1. A solar module array constructed from a multiplicity of adjacently disposed solar module constructions,
   wherein each of the solar module constructions comprises:
   a support unit with a triangular base and a plurality of triangular lateral planes, wherein the support unit forms a pyramidal supporting frame,
wherein the triangular base is spanned by base struts and the triangular lateral planes are spanned by lateral struts;
a first flexible material is stretched over a first of the triangular lateral planes,
a second flexible material is stretched over a second of the triangular lateral planes,
wherein each of the first and second flexible material has at least one feature of transparency, reflectivity, structure, sound absorbency, and tint,
wherein the at least one feature of the first flexible material differs from the at least one feature of the second flexible material,
and photovoltaic units provided on at least one of the triangular lateral planes of the support unit,
wherein the photovoltaic units comprise flexible solar modules attached on an outside surface of the first and/or second flexible material of at least one of the triangular lateral planes,
wherein two adjacently disposed solar module constructions within the solar module array form a solar module pair, in which the bases of the two adjacently disposed solar module constructions within the pair abut one another to form a parallelogram.

2. The solar module array according to claim 1, wherein each of the first and second flexible materials is made of a flexible membrane or a flexible plate.

3. The solar module array according to claim 1, wherein each of the first and second flexible materials is made of a membrane element, which stretches over each of the first and second triangular lateral planes of the pyramidal supporting frame completely.

4. The solar module array according to claim 1, wherein the first and/or second triangular lateral plane provided with solar modules has a region with flexible solar modules and a free region without solar modules, the free region amounting to at least 10% of the triangular lateral plane-provided with solar modules.

5. The solar module array according to claim 1, wherein each of the first and second flexible materials is perforated.

6. The solar module array according to claim 1, wherein each of the first and second flexible materials has a reinforcement.

7. The solar module array according to claim 1, wherein the base of the pyramidal supporting frame forms an equilateral triangle and the lateral planes enclose an angle of 60° on a head region of the pyramidal supporting frame.

8. The solar module array according to one claim 1, wherein the pyramidal supporting frame is constructed modularly from the base struts, the lateral struts and corner connectors, which connect the base struts and the lateral struts and fix the flexible material over the lateral struts to the base.

9. The solar module array according to claim 8, wherein the modular pyramidal supporting frame has a head connector for connecting the lateral struts, which is installed on the lateral struts at least partially over a membrane in a head region of the solar module construction.

10. The solar module array according to claim 1, wherein at least two parallel support rods support the solar module constructions, whereby every two parallel support rods carry a multiplicity of solar module pairs.

11. The solar module array according to claim 4, wherein the free region amounts to between 20% and 35% of the triangular lateral plane-provided with solar modules.

12. The solar module array according to claim 6, wherein each of the first and second flexible material has a mesh reinforcement.

13. A solar module array constructed from a multiplicity of adjacently disposed solar module constructions,
wherein each of the solar module constructions comprises:
a support unit with a triangular base and a plurality of triangular lateral planes,
wherein the support unit forms a pyramidal supporting frame,
wherein the triangular base is spanned by base struts and the triangular lateral planes are spanned by lateral struts;
a first flexible material is stretched over a first of the triangular lateral planes,
a second flexible material is stretched over a second of the triangular lateral planes,
wherein each of the first and second flexible material has at least one feature of transparency, reflectivity, structure, sound absorbency, and tint,
wherein the at least one feature of the first flexible material differs from the at least one feature of the second flexible material,
and photovoltaic units provided on at least one of the triangular lateral planes of the support unit,
wherein the photovoltaic units comprise flexible solar modules attached on an outside surface of the first and/or second flexible material of at least one of the triangular lateral planes,
wherein at least two parallel support rods support the solar module constructions, whereby every two parallel support rods carry a multiplicity of solar module pairs.

14. The solar module array according to claim 13, wherein each of the first and second flexible materials is made of a flexible membrane or a flexible plate.

15. The solar module array according to claim 13, wherein each of the first and second flexible materials is made of a membrane element, which stretches over each of the first and second triangular lateral planes of the pyramidal supporting frame completely.

16. The solar module array according to claim 13, wherein the first and/or second triangular lateral plane provided with solar modules has a region with flexible solar modules and a free region without solar modules, the free region amounting to at least 10% of the triangular lateral plane-provided with solar modules.

17. The solar module array according to claim 13, wherein each of the first and second flexible materials is perforated.

18. The solar module array according to claim 13, wherein each of the first and second flexible materials has a reinforcement.

19. The solar module array according to claim 13, wherein the base of the pyramidal supporting frame forms an equilateral triangle and the lateral planes enclose an angle of 60° on a head region of the pyramidal supporting frame.

20. The solar module array according to one claim 13, wherein the pyramidal supporting frame is constructed modularly from the base struts, the lateral struts and corner connectors, which connect the base struts and the lateral struts and fix the flexible material over the lateral struts to the base.

21. The solar module array according to claim 20, wherein the modular pyramidal supporting frame has a head connector for connecting the lateral struts, which is installed on the lateral struts at least partially over a membrane in a head region of the solar module construction.

22. The solar module array according to claim 16, wherein the free region amounts to between 20% and 35% of the triangular lateral plane-provided with solar modules.

23. The solar module array according to claim 18, wherein each of the first and second flexible material has a mesh reinforcement.

\* \* \* \* \*